United States Patent [19]

Monoi

[11] Patent Number: 5,311,319
[45] Date of Patent: May 10, 1994

[54] SOLID STATE IMAGE PICKUP DEVICE HAVING FEEDBACK VOLTAGE TO AMPLIFIER

[75] Inventor: Makoto Monoi, Tokyo, Japan

[73] Assignee: Kabushiki Kaisha Toshiba, Kawasaki, Japan

[21] Appl. No.: 858,844

[22] Filed: Mar. 27, 1992

[30] Foreign Application Priority Data

Mar. 27, 1991 [JP] Japan .................... 3-63244

[51] Int. Cl.[5] .............................. H04N 5/335
[52] U.S. Cl. .................... 348/300; 307/353; 307/359; 348/301
[58] Field of Search ............. 358/212, 213.15, 213.26, 358/213.27, 213.11; 307/353, 359; 377/60, 61, 62; 257/238, 239; H04N 5/335

[56] References Cited

U.S. PATENT DOCUMENTS

| | | | |
|---|---|---|---|
| 4,004,157 | 1/1977 | Baertsch et al. | 307/235 |
| 4,209,717 | 6/1980 | Mahony | 307/353 |
| 4,425,550 | 1/1984 | Smith et al. | 330/107 |
| 4,556,910 | 12/1985 | Tisue | 358/212 |
| 4,760,345 | 7/1988 | Busser et al. | 330/9 |
| 4,902,886 | 2/1990 | Smisko | 250/214 R |
| 4,987,321 | 1/1991 | Toohey | 307/520 |
| 4,996,686 | 2/1991 | Imai et al. | 377/60 |

FOREIGN PATENT DOCUMENTS

| | | | |
|---|---|---|---|
| 253016 | 1/1988 | European Pat. Off. | H03F 3/70 |
| 2352438 | 12/1977 | France | H03F 3/00 |
| 57-87606 | 9/1982 | Japan | H03F 1/30 |
| 58-92114 | 8/1983 | Japan | H03F 3/70 |
| 2111780 | 7/1983 | United Kingdom | H03F 1/34 |

*Primary Examiner*—Michael T. Razavi
*Assistant Examiner*—Tuan V. Ho
*Attorney, Agent, or Firm*—Foley & Lardner

[57] ABSTRACT

A voltage amplifier circuit, having a simple circuit construction and suitable for use as a high gain solid state image pickup device, is a differential circuit, one input terminal thereof being supplied with an input signal. At least one stage of an inverter circuit is serially connected to an output terminal of the differential circuit. An output terminal at the last stage of the inverter circuit is connected to the other input terminal of the differential circuit by an ON/OFF switch element controlled at a predetermined timing. In a signal transmission path there is no capacitor causing loss and delay.

4 Claims, 8 Drawing Sheets

SOLID STATE IMAGE PICKUP DEVICE HAVING FEEDBACK VOLTAGE TO AMPLIFIER

BACKGROUND OF THE INVENTION

This invention relates to a voltage amplifier circuit, and more particularly a voltage amplifier circuit especially suitable for use in an output circuit of a CCD (Charge Coupled Device) image sensor.

This invention also relates to an image pickup device, including the voltage amplifier circuit.

The CCD image sensor has been widely used as a semiconductor element for converting an optical image signal into an electric signal. For example, a CCD linear image sensor, including linearly arranged pixels, is an indispensable component as a light receiving element for reading picture images in facsimile devices and photocopying machines, etc.

A CCD linear image sensor is made up of a pixel array, including a plurality of linearly arranged pixels, CCD registers for temporarily holding electric charges generated by respective pixels for transferring, and shift gate circuits for transferring charges of the pixels array to the CCD registers. The signal charges transferred by the CCD registers are stored in floating-diffusion capacitors acting as charge accumulators, and a voltage variation thereof is detected by a source follower in the succeeding stage. This voltage variation is amplified by a voltage amplifier circuit for increasing the sensitivity and then outputted as a low impedance voltage output signal.

The voltage amplifier circuit is constituted by a plurality of inverter circuits and source follower circuits. Such a voltage amplifier circuit is formed on a chip together with the CCD sensor by taking into consideration decreases in cost and noise.

In a prior art voltage amplifier circuit, however, there are many problems that the circuit construction is complicated and the operating speed decreases, etc., caused by the relation between the linear input voltage range of the source follower in the previous stage and the operating point of the inverter.

SUMMARY OF THE INVENTION

Accordingly, it is an object of this invention to provide a novel voltage amplifier circuit having a simple circuit construction having a high gain and capable of operating at a high speed.

Another object of this invention is to provide a novel amplifier circuit capable of readily setting an operating point, reducing the circuit area and improving the degree of integration.

According to this invention there is provided a voltage amplifier circuit comprising: a differential circuit applied with an input signal to one input terminal thereof; at least one stage of an inverter circuit serially connected to an output terminal of said differential circuit; and negative feedback means for interconnecting an output terminal of a last stage inverter circuit and the other input terminal of said differential circuit through switch means which is ON/OFF controlled at a predetermined timing, and for feeding back a signal at the output terminal of the last stage inverter circuit.

According to the voltage amplifier circuit of the present invention, a switch is set to the conductive state before applying input signals so as to set an operating point of a first stage inverter. The operating point can then be easily and stably set within a predetermined input voltage range.

It is a further object of this invention to provide an image pickup device having a simplified construction and good signal output characteristics.

According to this invention, there is provided a solid state image pickup device wherein the above-mentioned and a semiconductor element for converting a photopicture image signal into an electric signal are formed on the same substrate.

DESCRIPTION OF THE PREFERRED EMBODIMENT

Before describing this invention, the problems of prior art amplifier systems will firstly be described.

Figure 1:
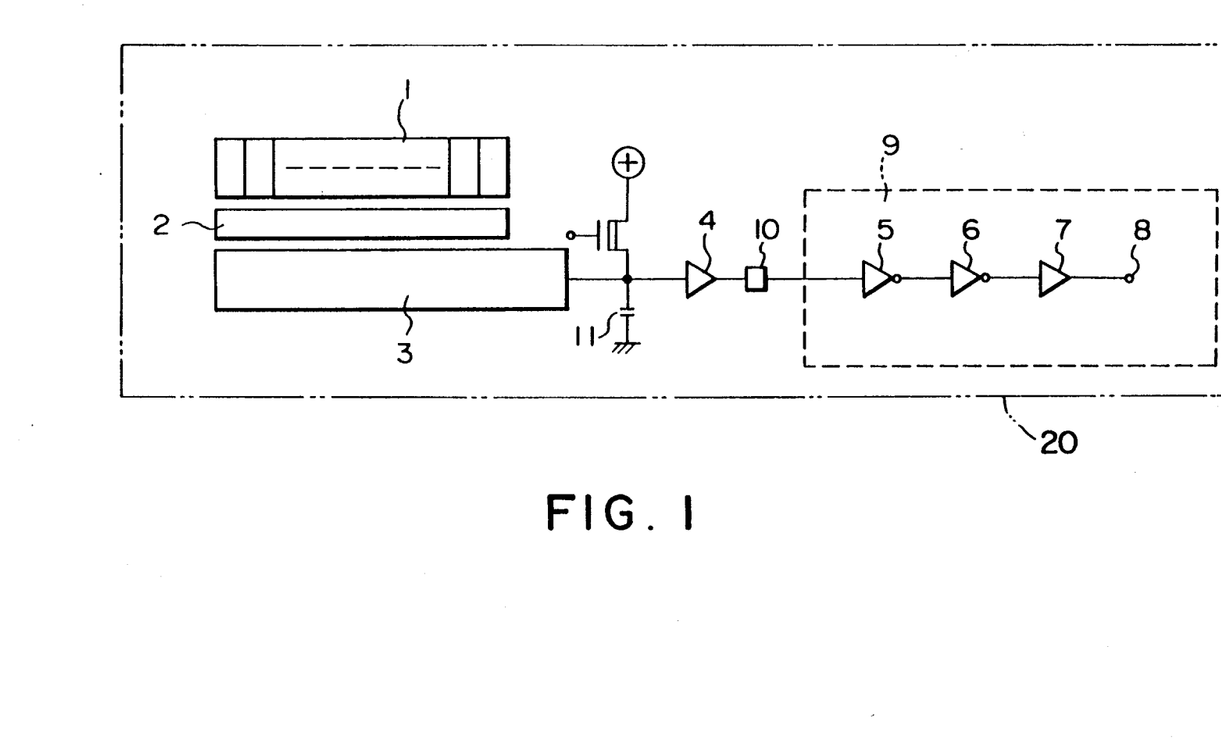
FIG. 1 is a diagrammatic representation showing a general construction of a solid state image pickup device including CCD linear image sensor.

FIG. 1 is a diagrammatic representation showing the general construction on a substrate 20 of a solid state image pickup device having a typical CCD linear image sensor and its output signal lending section. The CCD linear image sensor comprises a pixel array 1 in which a plurality of pixels are linearly arranged, a CCD register 3 for temporarily holding electric charge generated by respective pixels for transferring, a shift gate circuit 2 for transferring the electric charges from the pixel array 1 to the CCD register 3.

The signal charges transferred by the CCD register 3 are stored in a floating-diffusion capacitor 11 connected to the output terminal, and its voltage variation is detected by a source follower 4 in the succeeding stage and outputted from the output terminal 10 of the source follower 4 as a low impedance voltage output signal. This voltage output signal is applied to a voltage amplifier circuit 9 constituted by a plurality of inverter circuits 5 and 6 and a source follower circuit 7 to be subjected to a predetermined voltage amplification and then appears at output terminal 8 as an output signal.

Figure 2:
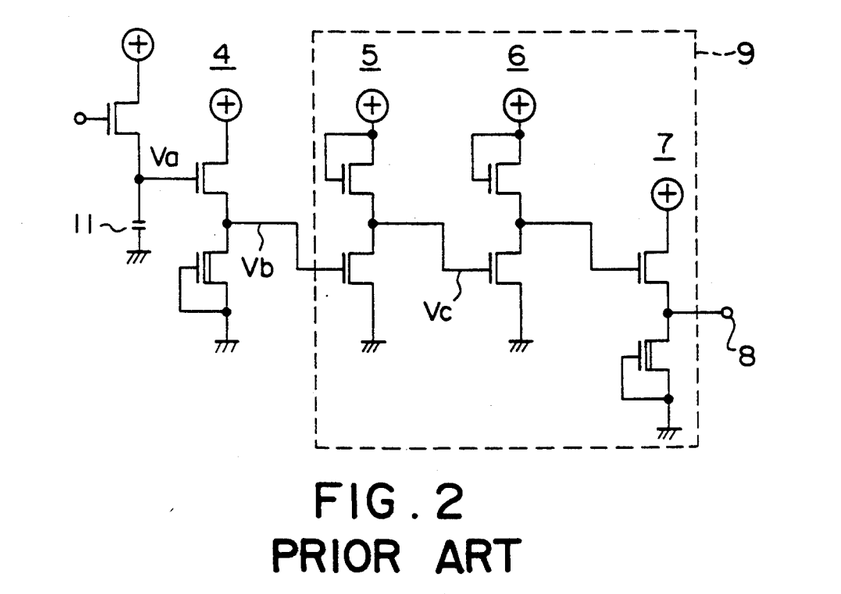
FIG. 2 is a connection diagram showing one example of a prior art voltage amplifier circuit.

FIG. 2 shows one example of a detailed circuit construction of the source follower circuit 4 and the voltage amplifier circuit 9. As can be clearly noted from FIG. 2, in the voltage amplifier circuit 9, two inverter circuits 5 and 6 are connected in the succeeding stage of the source follower circuit 4, and a source follower circuit 7 is connected in the last stage so as to obtain a low impedance output from an output terminal 8.

Figure 3:
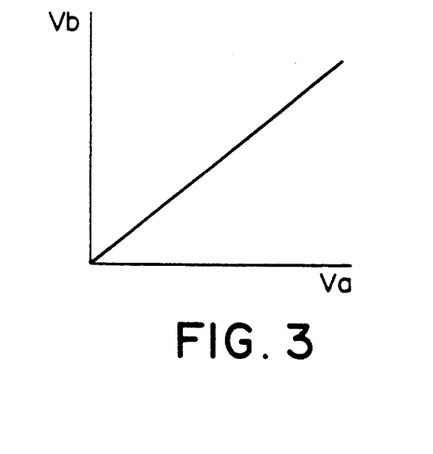
FIG. 3 is a graph showing an input/output characteristic of an inverter.
Figure 4:
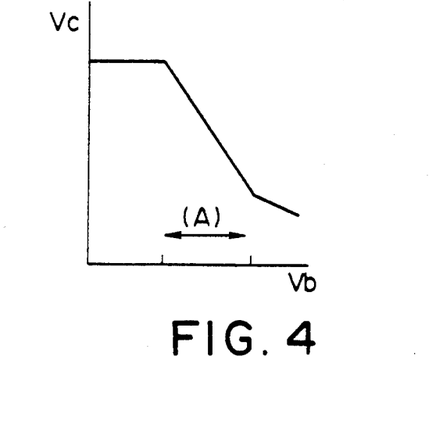
FIG. 4 is a graph showing the operating point setting of the inverter circuit.

FIG. 3 is a graph showing the relationship between the input voltage Va to the source follower 4 and the output voltage Vb, and FIG. 4 shows the relation between the input voltage Vb and the output voltage Vc of the inverter circuit 5.

As can be clearly noted from these figures, in the source follower circuit 4, although the input and output voltages vary rectilinearly in a wide range, in the inverter circuit 5, only when the input voltage Vb is in a range shown by A of FIG. 4 an inverting amplification in the linear region can be performed.

As above described, in the voltage amplifier circuit shown in FIG. 2, as the gain of the inverter circuit 5 or 6 is increased, the linear input voltage range A becomes small so that the setting of the offset of the input voltage becomes difficult.

Figure 5:
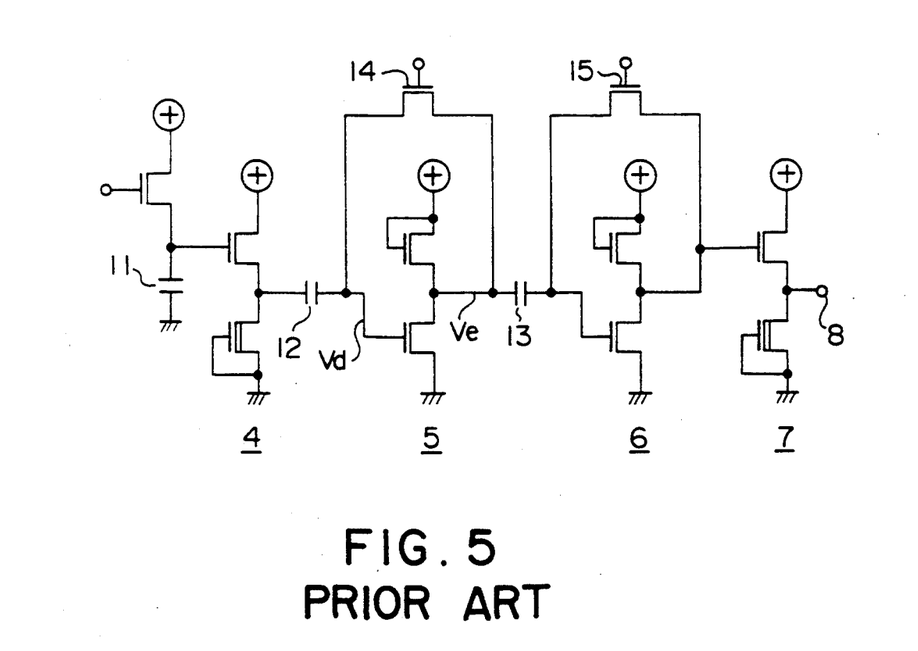
FIG. 5 is a connection diagram showing one example of the prior art voltage amplifier circuit.

As a method of solving this problem, a circuit as shown in FIG. 5 has been proposed. In this circuit, the d.c. components of the inputs to respective inverter circuits 5 and 6 are cut off by capacitors 12 and 13 respectively, and in a period prior to the application of the input signal, switches 14 and 15 for respectively interconnecting inputs and outputs of inverter circuits 5 and 6 are closed for a predetermined interval so as to set the operating points of inverter circuits 5 and 6.

Figure 6:
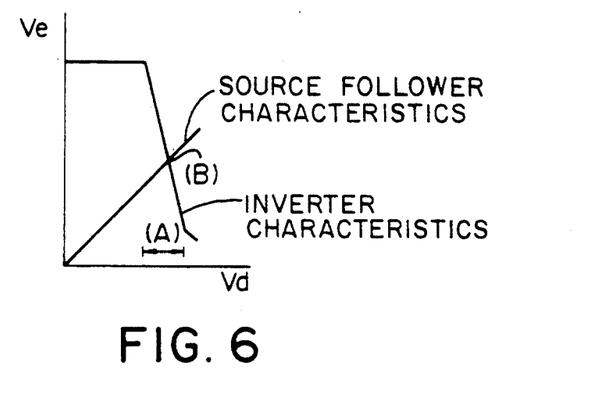
FIG. 6 is a graph showing the input/output characteristics of a source follower circuit.

FIG. 6 is a graph showing the relation between the input voltage Vd and the output voltage Ve of the inverter circuit 5 shown in FIG. 5. The operating point is set at a point B shown in FIG. 6.

However, in the circuit shown in FIG. 5, there is a problem in the method of forming capacitors 12 and 13. For the purpose of preventing noise, there is a method in which capacitors 12 and 13 are formed by using a capacitance between metal electrodes. For example, where the capacitors 12 and 13 are formed by using the capacitance between a first polycrystalline silicon electrode and a second polycrystalline silicon electrode. The breakdown voltage between the electrodes is low and so there is a possibility of occurrence of the breakdown. Furthermore, for the purpose of preventing loss of the gain, the size of the capacitors 12 and 13 should be increased more or less. However, for attaining this object, the circuit areas necessary to form these capacitors should be increased. There are further problems with the prior art, such as the operation set time becoming long and the floating capacitance increasing, with the result that the operating speed decreases.

Figure 7:
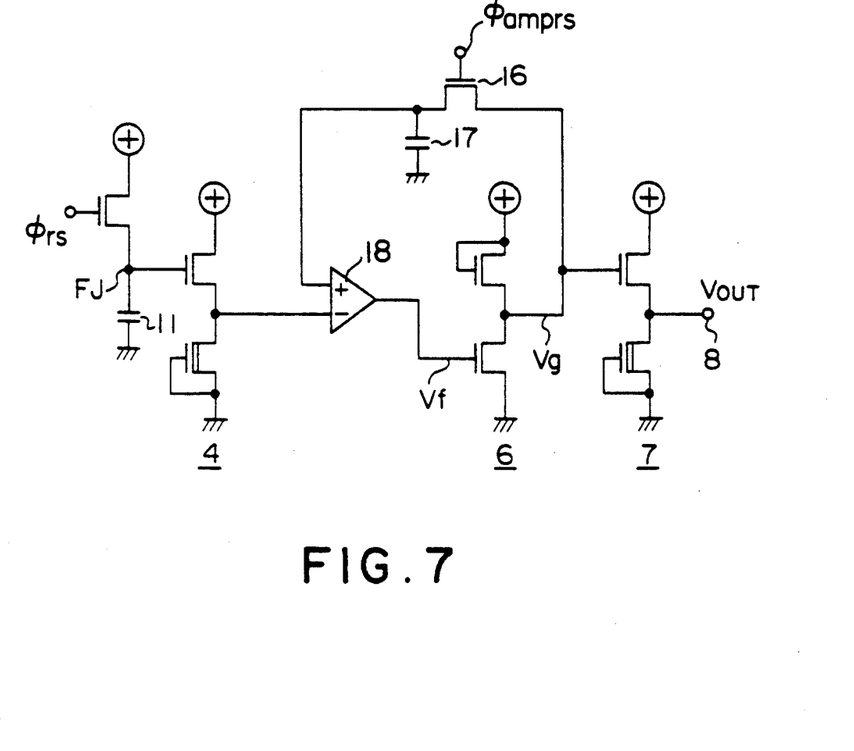
FIG. 7 is a connection diagram showing the construction of the voltage amplifier circuit according to one embodiment of this invention.

FIG. 7 is a connection diagram showing the construction of a voltage amplifier circuit according to one embodiment of this invention. Parts identical to these of prior art circuits are denoted by the same reference numerals, and so a detailed description is not made.

In the circuit of this invention, the output of the source follower circuit 4 is applied to one negative input terminal of a differential circuit 18. Furthermore, the output Vg of the inverter circuit 6 is applied to the positive input terminal of the differential circuit 18 via a MOS switch 16, the gate electrode thereof being supplied with an amplifier reset signal $\phi_{amprs}$. This connection forms a negative feedback circuit. Between the connection node of switch 16 and differential circuit 18 and a grounding point is connected a grounding capacitor 17 so as to hold the operating point voltage in the grounding capacitor. This grounding capacitor 17 can be readily formed by utilizing the capacitance of a gate oxide film of a polycrystalline silicon electrode, for example. Moreover, this circuit construction can readily obtain a large capacitance, high breakdown voltage and low susceptibility to noise.

Figure 8:
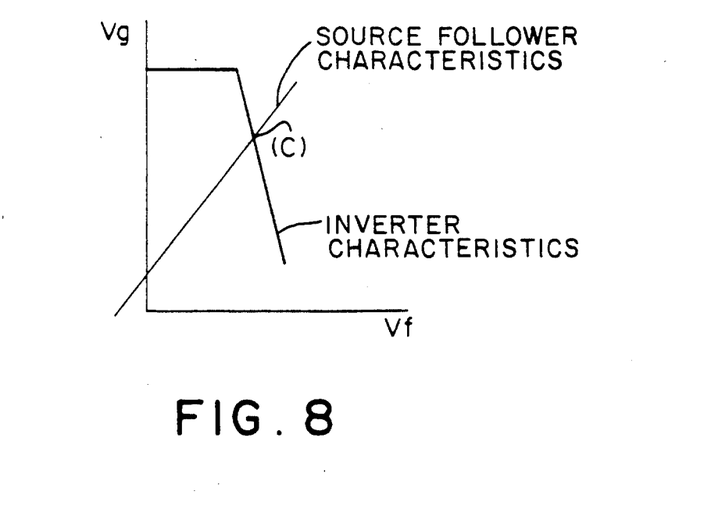
FIG. 8 is a graph showing the operating point of an inverter according to this invention.

FIG. 8 is a graph showing the relation between the input voltage Vf to the inverter circuit 6 and the output voltage Vg, in which the operating point is set at a point C.

Figure 9:
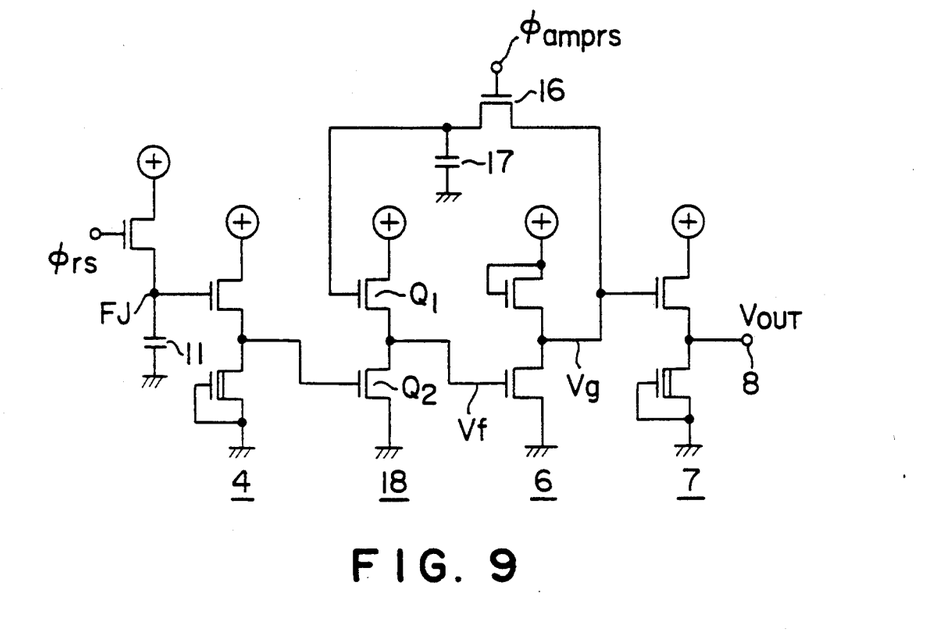
FIG. 9 is a connection diagram showing the construction of the voltage amplifier circuit according to the present invention using one type of differential circuit.

FIG. 9 is a connection diagram showing the construction of the voltage amplifier circuit according to the present invention using one type of differential circuit 18. This differential circuit includes two serially connected MOSFET's Q1 and Q2 between the two power terminals. The feedback signal from the MOS switch 16 is applied to a gate terminal of the first MOSFET Q1. The output signal of the source follower circuit 4 is applied to a gate terminal of the second MOSFET Q2. Furthermore, the connection node between the two transistors Q1 and Q2 is connected to the input terminal of the inverter 6.

This construction of the differential circuit can easily be obtained using the same number as elements of an inverter, resulting in avoiding any increase in the number of elements and the area.

Figure 10:
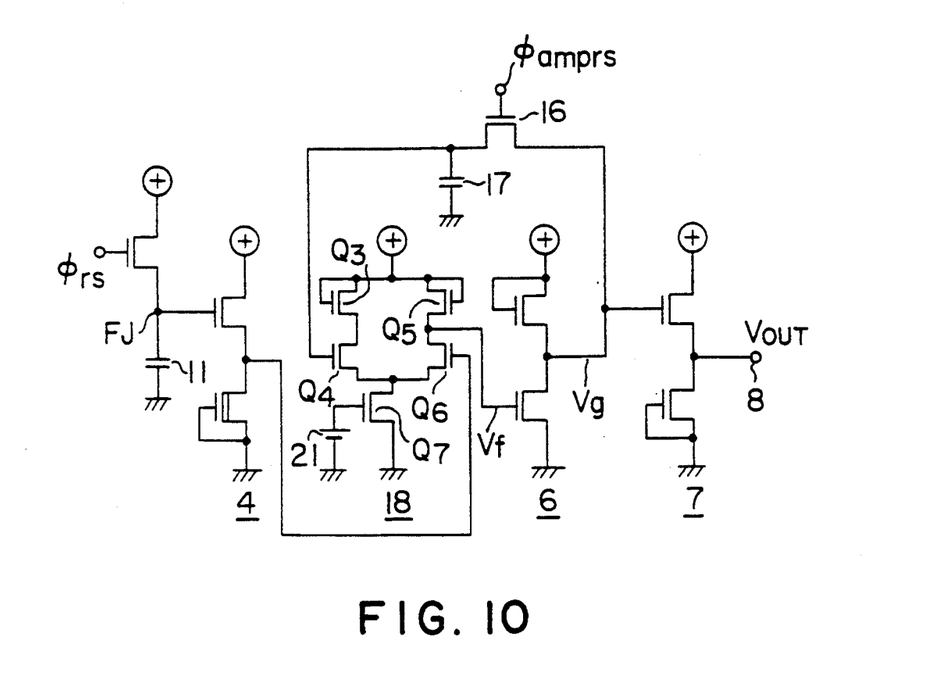
FIG. 10 is a connection diagram showing the construction of the voltage amplifier circuit according to the present invention using an other type of differential circuit.

FIG. 10 shows construction of the voltage amplifier using another type of differential circuit 18. This differential circuit is composed of five transistors Q3–Q7 and a voltage supply 21. A transistor Q3 which is self-biased to the power supply terminal and a transistor Q4 are serially connected. Similarly, a transistor Q5 which is self-biased to the power supply terminal and a transistor Q6 are serially connected. These two serially connected transistors are connected between the power supply terminal through the drain terminal of a transistor Q7. The source thereof is connected to the ground terminal and the gate thereof is connected to the ground through a voltage supply 21.

In these constructions, the output of the MOS switch is applied to the gate of transistor Q4, and the output of the source follower circuit 4 is applied to the gate of the transistor Q6. The differential output is taken from the connection node of Q5 and Q6.

Figure 11:
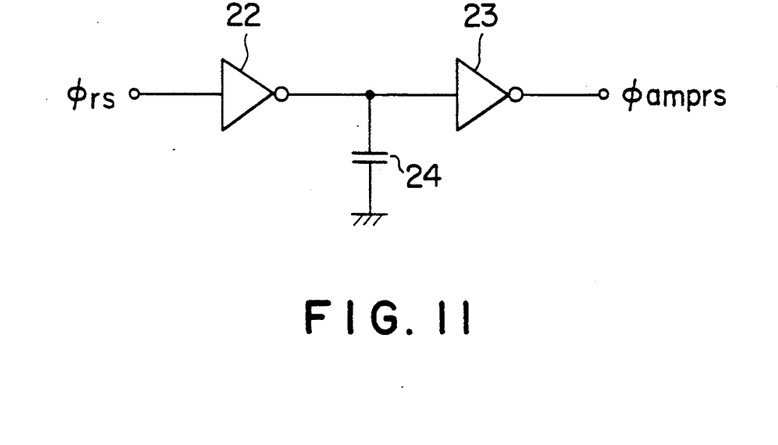
FIG. 11 is a connection diagram showing the construction of an amplifier reset signal generator.

FIG. 11 shows an amplifier reset signal generator circuit. This circuit has two stages of inverters and a capacitor connected between a connection node of the two inverters and the ground.

This circuit generates $\phi_{amprs}$ signal by delaying the $\phi_{rs}$ signal.

Figure 12:
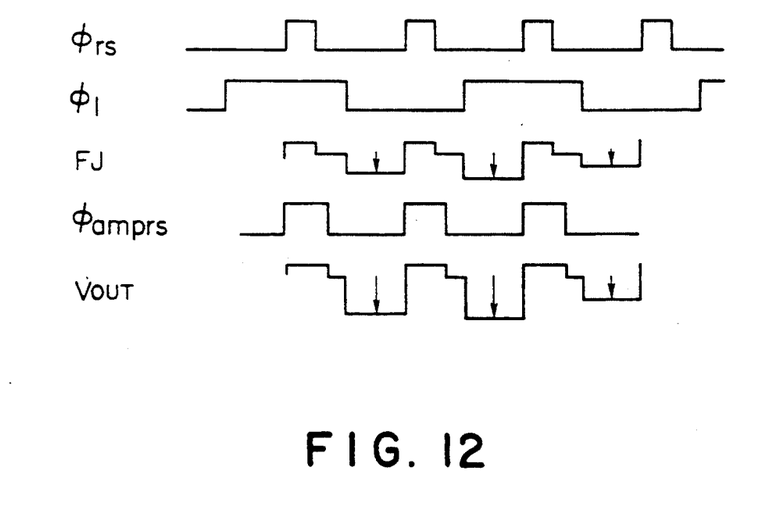
FIG. 12 is a timing chart showing the timings of various voltage waveforms impressed upon the circuit of this invention.

FIG. 12 is a timing chart showing the operating timings of various voltages applied to the circuit shown in FIG. 9. The operation of the voltage amplifier circuit of this invention will be described with reference to the timing chart shown in FIG. 12.

Immediately before inputting a signal FJ appearing at one terminal of a floating-diffusion capacitor 11 to one terminal of the differential circuit 18, the switch 16 is caused to close for a predetermined period by the signal $\phi_{amprs}$, thereby setting the operating point shown in FIG. 8. Thereafter, an input signal $\phi_{rs}$ and a timing signal $\phi_1$ are inputted. The operating point voltage set at this time is held by a voltage determined by the grounding capacitor 17. As a consequence, there is no capacitance between the source follower and the inverter circuit which constitutes a signal transmission path, so the gain of a given signal can be amplified at a high speed without any loss.

Since the grounding capacitor acting as a holding capacitor can readily raise its operating point set with a relatively small capacitance, the circuit area can be reduced, thereby enabling the degree of integration to be improved.

In the above embodiment, since the falling edge of $\phi_{amprs}$ exists during a feed through period of output signals, switching (reset) noise of the voltage detector circuit can be effectively eliminated using a correlated double sampling method.

The falling edge of $\phi_{amprs}$ may be of the same timing or before that of $\phi_{rs}$. In the former case, while the reset pulses cannot be eliminated, there is no need to provide a special pulse generating circuit.

FIGS. 13 to 16 show various variations of the embodiment shown in FIG. 9.

Figure 13:
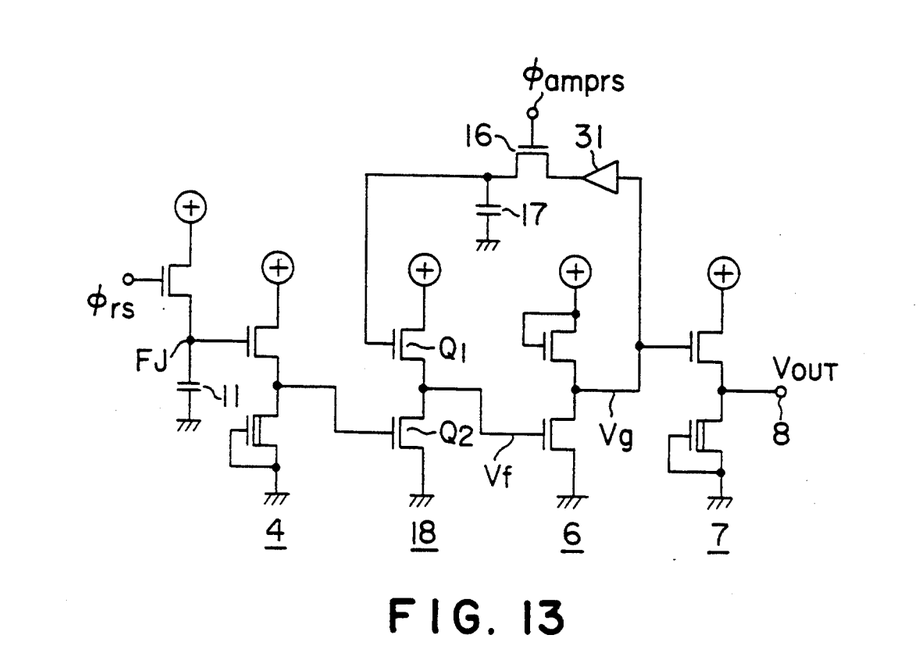
FIG. 13 is a connection diagram showing the construction of the voltage amplifier circuit having a level shifter according to the present invention.

In FIG. 13, a level shifter 31 is inserted between the output point of the inverter 6 and the MOS switch 16. Similarly, In FIG. 14, a level shifter 31 is inserted between the MOS switch 16 and the gate of transistor Q1.

Figure 14:
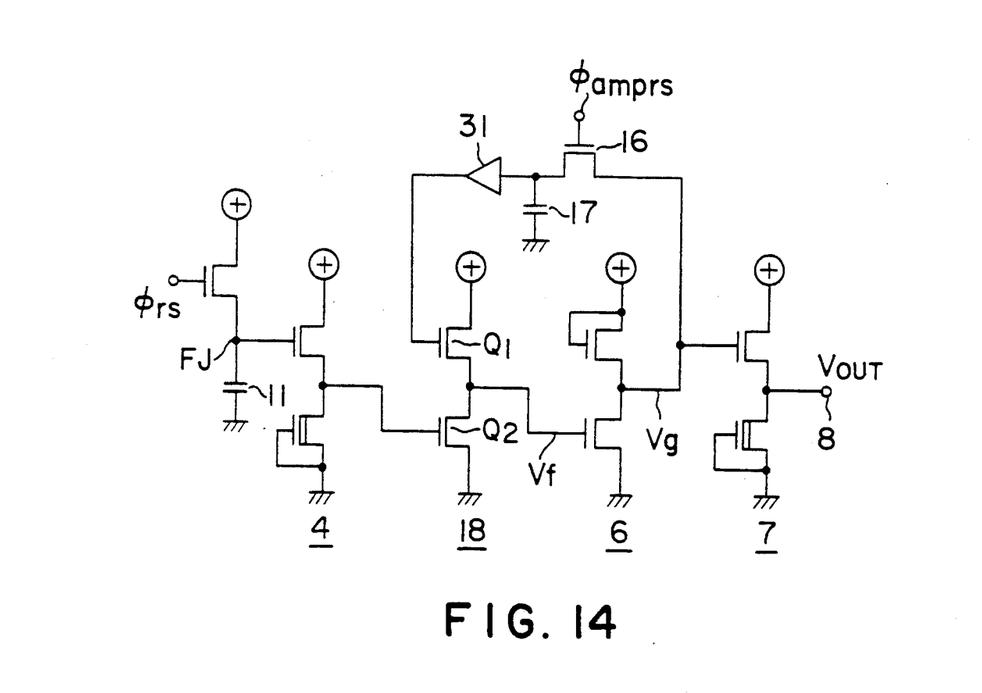
FIG. 14 is a connection diagram showing the construction of another voltage amplifier circuit having a level shifter according to the present invention.

In these two embodiments, the level shifters can set the Vg level at an appropriate operating point, by adjusting the d.c. offset.

Figure 15:
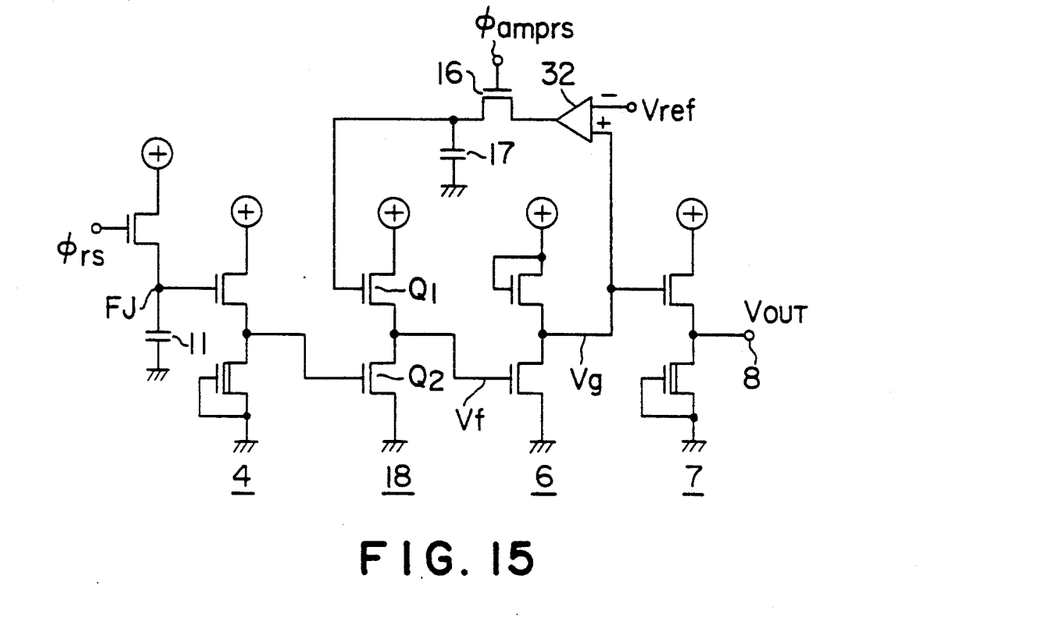
FIG. 15 is a connection diagram showing the construction of the voltage amplifier circuit having another level setter according to the present invention.

FIG. 15, a differential circuit 32 as a level setter is inserted between the output point of the inverter 6 and the MOS switch 16. Similarly, in FIG. 16, a differential circuit 32 as a level setter is inserted between the MOS switch 16 and the gate of transistor Q1. In these figures, signal Vg is inputted to the positive side of the differential circuit 31 and a reference voltage is inputted to the negative side of the differential circuit.

Figure 16:
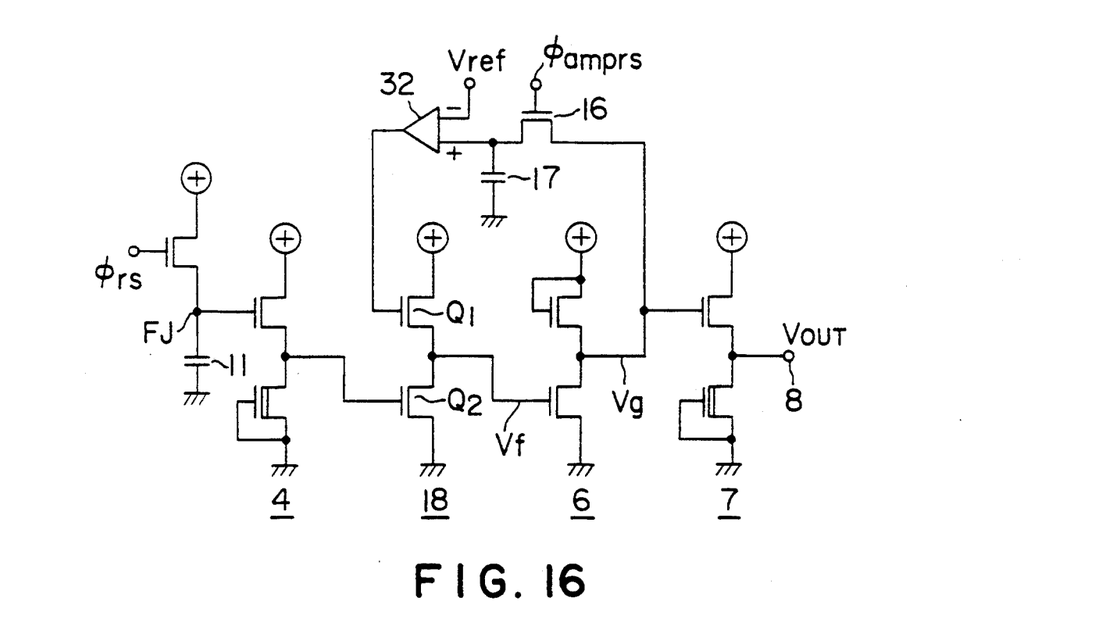
FIG. 16 is a connection diagram showing the construction of the voltage amplifier circuit having another level setter according to the present invention.

In these two embodiments, the Vg level is changed by appropriately setting the Vref level.

Although in the embodiment shown in FIG. 7, the circuit is constructed such that the signal $\phi_{amprs}$ is applied for closing switch 16 and the timing which sets the operating point is set at each read out of respective pixels such setting can be made once at the time of reading out of the pixels of one line. In this case, the period necessary to hold the operating point becomes so long that it is necessary to increase the capacity of the grounding capacitor 17. Furthermore, in the embodiment shown in FIG. 7, the inverter circuit comprises a single stage but any number stages of (two or more) can be connected to constitute the inverter circuit.

What is claimed is:

1. A solid state image pickup device comprising:
   photoelectric conversion means for converting incident light to electric signals;
   a different circuit, one input terminal thereof being supplied with output signals from said photoelectric conversion means;
   an inverter circuit having at least one stage thereof serially connected to an output terminal of said differential circuit;
   negative feedback loop means for interconnecting an output terminal of a last stage of said inverter circuit and the other input terminal of said differential circuit through a switch means which is ON/OFF controlled at a predetermined timing, and for feeding back a signal at the output terminal of the last stage inverter circuit; and
   a grounding capacitor connected between a junction between said switch means and said other input terminal of said differential circuit and a grounding point the grounding capacitor holding an operating point voltage of a first stage of the inverter circuit at a voltage determined by said grounding capacitor by closing said switch means during a period prior to application of said output signal of said photoelectric conversion means.

2. The solid state image pickup device according to claim 1, wherein said diffcrential circuit includes first and second MOS transistors serially connected between power supply terminals, a gate terminal of said first MOS transistor being supplied with a feedback signal and a gate terminal of said second MOS transistor being supplied with said input signal.

3. The solid state image pickup device according to claim 1, further comprises a level shifter in the feedback loop.

4. The solid state image pickup device according to claim 1, further comprises a level setter which sets a feedback signal level in the feedback loop.

* * * * *